United States Patent [19]

Ito

[11] Patent Number: 4,869,924
[45] Date of Patent: Sep. 26, 1989

[54] METHOD FOR SYNTHESIS OF DIAMOND AND APPARATUS THEREFOR

[75] Inventor: Toshimichi Ito, Tokyo, Japan

[73] Assignee: Idemitsu Petrochemical Company limited, Tokyo, Japan

[21] Appl. No.: 238,681

[22] Filed: Aug. 31, 1988

[30] Foreign Application Priority Data

Sep. 1, 1987 [JP] Japan .................. 62-218138

[51] Int. Cl.$^4$ ............................ B05D 3/14
[52] U.S. Cl. ..................... 427/39; 118/723; 427/45.1
[58] Field of Search .......... 427/39, 45.1; 118/723; 423/446; 156/DIG. 65; 204/173

[56] References Cited

U.S. PATENT DOCUMENTS

| | | |
|---|---|---|
| 3,030,187 | 4/1962 | Eversole . |
| 3,030,188 | 4/1962 | Eversole . |
| 3,371,996 | 3/1968 | Hibshman . |
| 4,434,188 | 2/1984 | Kamo et al. ............. 427/39 |
| 4,532,199 | 7/1985 | Ueno et al. ............. 427/39 |
| 4,728,529 | 3/1988 | Etzkorn . |

FOREIGN PATENT DOCUMENTS

| | | |
|---|---|---|
| 628567 | 10/1961 | Canada . |
| 0230927 | 1/1987 | European Pat. Off. . |
| 140985 | 9/1980 | Fed. Rep. of Germany . |
| 58-91100 | 5/1983 | Japan . |
| 58-110494 | 7/1983 | Japan . |
| 58-135117 | 8/1983 | Japan . |
| 59-63732 | 4/1984 | Japan . |
| 60-103099 | 6/1985 | Japan . |
| 60-191097 | 2/1986 | Japan . |
| 61-158198 | 12/1986 | Japan . |
| 61-158899 | 12/1986 | Japan . |
| 0286299 | 12/1986 | Japan . |
| 61-183198 | 1/1987 | Japan . |
| 8703307 | 4/1987 | Japan . |
| 64-24094 | 1/1989 | Japan . |

Primary Examiner—Stanley Silverman
Attorney, Agent, or Firm—Armstrong, Nikaido, Marmelstein, Kubovcik & Murray

[57] ABSTRACT

This invention provides a method for synthesis of diamond by contacting a substrate with a mixed gas of carbon source gas and hydrogen gas activated by irradiation with microwave to produce plasma, thereby to deposit diamond on the surface of the substrate wherein microwave is introduced from a plurality of directions to the substrate and an apparatus for synthesis of diamond which comprises at least one microwave oscillator which oscillates microwave, a plurality of waveguides for introducing from a plurality of directions the microwave oscillated from said microwave oscillator to a substrate for deposition of diamond, and a reaction chamber which is connected to said waveguides and in which diamond is deposited by generation of plasma thereby to form a diamond thin film on the surface of said substrate.

6 Claims, 1 Drawing Sheet

METHOD FOR SYNTHESIS OF DIAMOND AND APPARATUS THEREFOR

BACKGROUND OF THE INVENTION

1. Field of the Invention

This invention relates to an improved method for synthesis of diamond and an apparatus used therefor. More particularly, it relates to a method for synthesis of diamond by a microwave plasma CVD method according to which area of synthesis of diamond can be markedly enlarged as compared with conventional methods and an apparatus necessary for practice of the method.

2. Description of the Related Art

Recently, technique for synthesis of diamond has been remarkably developed and synthetic diamond has been widely used, for example, as various protecting films, optical materials, electronic materials and chemical industry materials.

For forming a thin film of diamond on the surface of a substrate, it is known to form a diamond thin film on the surface of substrate by deposition of diamond by various means such as chemical vapor phase deposition method (CVD method), ion beam method, and chemical transport method using raw material gas containing a carbon source.

Especially, method of forming a diamond thin film at low temperatures by the chemical vapor phase deposition method has been recently noticed because continuous operation is easy and this method is industrially advantageous.

It is important for industriallization of this CVD method how to activate a mixed gas. There have been known (1) the hot filaments CVD method by which a mixed gas is led to activated state by passing it near ignited filaments, (2) the high frequency plasma CVD method by which a mixed gas is led to activated state by applying high frequency to introduction part of a mixed gas to produce plasma there by the high frequency, (3) the microwave plasma CVD method by which a mixed gas is led to activated state by introducing microwave into gas introduction part to form plasma there by the microwave.

Among them, especially the microwave plasma CVD method is superior in reproducibility of activated state and gives no consumption parts and this is promising.

However, since in the conventional microwave plasma CVD method, microwave oscillated from one microwave oscillator is introduced into plasma generator [Japanese Patent Application Kokai (Laid-open) No. 91100/83], area of synthesis of diamond depends on wavelength of microwave and when a microwave of 2.45 GHZ is used, about 2 inches in diameter is maximum. This, there are problems that the area of synthesis is small and use of diamond produced is limited.

SUMMARY OF THE INVENTION

The object of this invention is to provide a method for synthesis of diamond by industrially advantageous microwave plasma method which solves the above problems of the conventional microwave plasma CVD methods and can increase area of synthesis of diamond and an apparatus suitable for practice of the method.

The inventor have found that the above object can be accomplished by introducing microwave from a plurality of directions to a substrate in synthesis of diamond by microwave plasma CVD method. This invention is based on this finding.

That is, the first invention is a method for synthesis of diamond which comprises contacting a substrate with a mixed gas of carbon source gas and hydrogen gas activated by producing plasma with irradiation of microwave, thereby to deposit diamond thereon, characterized in that microwave is introduced from a plurality of directions to the substrate. The second invention is an apparatus for synthesis of diamond which comprises at least one microwave oscillator which oscillates microwave, a pluraity of waveguides for introduction of microwave oscillated from said microwave oscillator from a plurality of directions to a substrate on which diamond is deposited and a reaction chamber which is connected to said waveguides and in which a diamond thin film is formed on the surface of the substrate by generation of plasma and deposition of diamond thereby.

DETAILED DESCRIPTION OF THE PREFERRED EMBODIMENT

Figure 1:
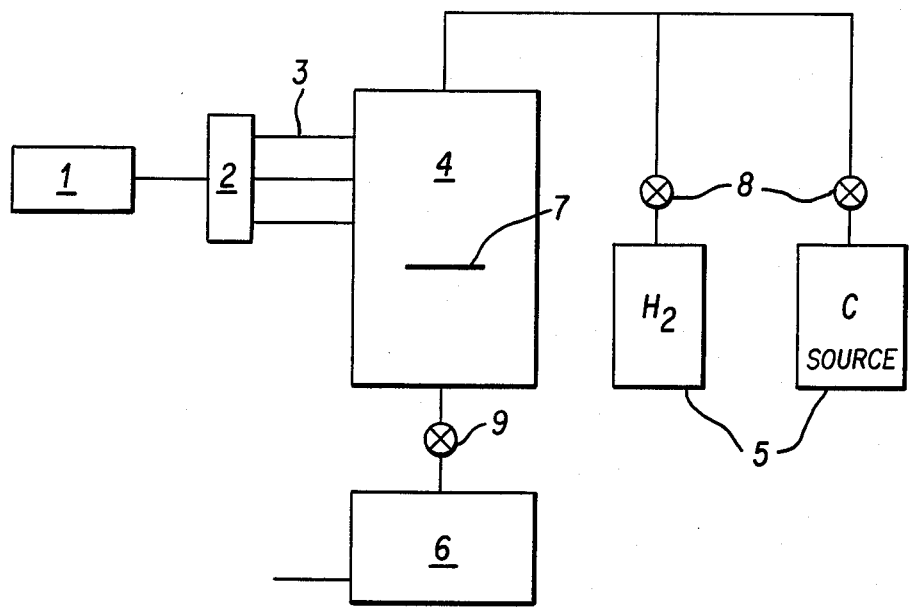
FIG. 1 shows diagrammatically one example of apparatus for synthesis of diamond according to this invention.

In this invention, a mixed gas of carbon source gas and hydrogen gas is used as a raw material gas.

As the carbon source gas, mention may be made of, for example, alkanes such as methane, ethane, propane, butane, pentane and hexane; alkenes such as ethylene, propylene, butene, pentene and butadiene; alkynes such as acetylene; aromatic hydrocarbons such as benzene, toluene, xylene, indene, naphthalene and phenanthrene; cycloparaffins such as cyclopropane and cyclohexane; and cycloolefins such as cyclopentene and cyclohexene.

Furthermore, as the carbon source gas, there may also be used oxygen-containing carbon compounds such as carbon monoxide, carbon dioxide, methyl alcohol, ethyl alcohol and acetone and nitrogen-containing carbon compounds such as methylamine, ethylamine and aniline. Further, although not single substances, the following may also be effectively used: gasoline, kerosine, turpentine oil, camphor oil, pine root oil, heavy oils, gear oil and cylinder oil. The above various carbon compounds may also be used in admixture. Among them, preferred are carbon monoxide, carbon dioxide and mixed gases of them with hydrocarbon gases because deposition rate of diamond is increased.

Concentration of carbon source gas in the raw material gas is normally 0.1–90 vol %, preferably 0.2–80 vol %. If this concentration is less than 0.1 vol %, deposition rate of diamond is low or sometimes diamond is not deposited. If more than, 90 vol %, sometimes, crystallinity is decreased.

The raw material gas may contain an inert gas as far as the object of this invention is not damaged. The inert gas includes, for example, nitrogen, rare gases such as argon, neon and xenon. These may be used alone or in combination of two or more.

The substrate used in this invention is not critical and there may be used any of, for example, metals such as silicon, aluminum, titanium, tungsten, molybdenum, cobalt, chrominum, nickel, copper and iron, oxides, nitrides and carbides of these metals, alloys of these metals, cermets such as $Al_2O_3$-Fe, TiC-Ni, TiC-Co, TiC-TiN and $B_4C$-Fe systems and various ceramics.

The substrate may be of any forms such as, for example, sheet, rod, wire, pipe and molded bodies of specific shapes.

The method of this invention comprises forming a diamond thin film on a substrate by contacting the substrate with a gas obtained by activating said raw material gas and this is characterized in that microwave plasma CVD method is used for the activation and the microwave is introduced from a plurality of directions to said substrate using microwave waveguides and thereby area of synthesis of diamond is much increased than by the conventional methods.

According to this invention, a diamond thin film is formed on the surface of substrate and the surface of substrate is kept normally at 400°-1200° C., preferably at 450°-1100° C. When this temperature is lower than 400° C., deposition rate of diamond is low or sometimes diamond is not deposited. When higher than 1200° C., the deposited diamond is scraped by etching or deposition rate is low.

Reaction pressure is normally 0.001-1000 Torr, preferably 1-800 Torr. When this is lower than 0.001 Torr, deposition rate is low or diamond is not deposited. When higher than 1000 Torr, effect for increase of the pressure is not obtained and in some case, deposition rate of diamond decreases.

One typical embodiment of this invention is explained referring to the apparatus shown in the accompanying drawings. FIG. 1 diagrammatically shows one example of the apparatus of this invention. This apparatus has microwave oscillator 1, a plurality of waveguides 3 for introduction of microwave oscillated from microwave oscillator 1 from a plurality of directions to substrate 7 for deposition of diamond and reaction chamber 4 which is connected to said waveguides 3 and in which a diamond thin film is formed on substrate 7 by production of plasma and deposition of diamond thereby.

Said microwave oscillator 1 has oscillating function at microwave band (frequency 1000 MHz-100 GHz) and examples thereof are conventional microwave tubes such as velocity modulation tube, klystron and magnetron.

In this invention, especially ISM frequency band can be suitably used among microwaves.

2 is a branching tube for leading the microwave oscillated from microwave oscillator 1 to a plurality of waveguides 3. This branching tube includes, for example, two-direction branching tube, three-direcdtion branching tube, T-type branching tube and E-cornered waveguide. By using one of them or two or more in combination, microwave oscillated from microwave oscillator can be led to the desired number of waveguides and can be introduced from desired directions to the substrate. Direction and number of the microwave can be optionally chosen depending on the desired area of synthesis of diamond. Moreover, microwave oscillated from one microwave oscillator may be branched by branching tube as mentioned above or microwave may be introduced from a plurality of directions to the substrate by using a plurality of oscillators without using branching tube or these methods may be combined.

Further, by combination of the branching tube, not only intensity of microwave can be respectively uniformly branched, but also microwave can be branched to intensities of desired ratio.

In this invention, as mentioned above, microwave oscillated from at least one microwave oscillator is fed to reaction chamber 4 in such a manner that it is introduced from a plurality of directions to substrate and a mixed gas of carbon source gas and hydrogen gas is irradiated with the microwave to form plasma thereby to activate the mixed gas.

The mixed gas of carbon source gas and hydrogen gas is fed into reaction chamber 4 by gas feeding device 5. In the reaction chamber 4, there is placed substrate 7 on the surface of which diamond is deposited and, if necessary, this substrate 7 is heated in a heating furnace and then is used. Feeding amount and discharging amount of the raw material gas can be adjusted by feeding amount adjusting valve 8 and discharging amount adjusting valve 9.

Mixed gas in activated state reaches the surface of substrate 7 to deposit diamond on this surface of the substrate. Reaction gas after used is evacuated by evacuating device 6.

Figure 2:
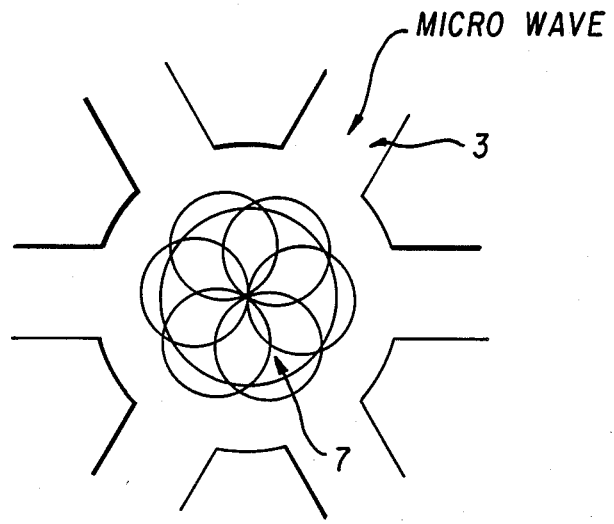
FIG. 2 shows diagrammatically the state of introduction of microwave from various directions to the substrate in the reaction chamber. In these FIGS. 1 and 2, 1 indicates a microwave oscillator, 2 indicates a microwave branching tube, 3 indicates a waveguide, 4 indicates a reaction chamber and 7 indicates a substrate.

FIG. 2 diagrammatically shows the state of microwave being introduced from various directions to substrate 7 in the reaction chamber by waveguide 3.

According to this invention, microwave is introduced from a plurality of directions to the substrate. Therefore, the area of synthesis of diamond is at most about 2 inches in diameter according to the conventional methods when a microwave of, for example, 2.45 GHz is used while the area can be increased to more than 2 inches in diameter according to this invention. Thus, area of synthesis of diamond can be much increased and this is industrially very advantageous.

Diamond synthesized by this invention can be suitably used as various protecting films such as surface protecting films for cutting tools or optical materials, electronic materials or chemical industry materials.

The following nonlimiting examples explain this invention in more detail.

Example 1

Carbon monoxide gas and hydrogen gas are respectively introduced into a reaction tube containing a silicon wafer of 4 inches diameter as a substrate.

Then, output of microwave oscillator was set at 2.4 Kw and uniform output, namely, 0.4 Kw each was supplied to six-branched waveguide to carry out electrical discharging. In this case, amount of carbon monoxide gas was 10 SCCM, amount of hydrogen gas was 90 SCCM, substrate temperature was 900° C. and reaction pressure was 50 Torr. Reaction for 2 hours resulted in discharging on the 4 inch wafer to produce a diamond thin film of 10 $\mu$m thick.

Raman spectroscopic analysis of this thin film showed that no impurities other than diamond were present.

Example 2

A diamond thin film of 8 $\mu$m thick was formed on a 4 inches diameter silicon wafer in the same manner as in Example 1 except that acetone was used in place of carbon monoxide.

Raman spectroscopic analysis showed that no impurities were present other than diamond.

Example 3

Carbon monoxide gas and hydrogen gas were respectively introduced into a reaction tube containing a silicon wafer of 3×1 inch as a substrate.

Then, output of microwave oscillator was set at 0.8 Kw and uniform output, namely, 0.4 Kw each was supplied to two-branched waveguide to carry out electrical discharging. In this case, amount of carbon monoxide gas was 10 SCCM, amount of hydrogen gas was 90 SCCM, substrate temperature was 900° C. and reaction pressure was 50 Torr. Reaction for 2 hours resulted in discharging on the wafer of 3×1 inch to form a diamond thin film of 7 μm thick.

Raman spectroscopic analysis of this thin film showed that no impurities were present other than diamond.

What is claimed is:

1. In a method for the synthesis of diamond by contacting a substrate with a mixed gas of carbon source gas and hydrogen gas activated by irradiation with microwave to produce plasma and depositing diamond on the surface of the substrate, the improvement which comprises introducing microwave from a plurality of directions to the substrate.

2. A method according to claim 1 wherein the carbon source gas is generated from at least one compound selected from the group consisting of carbon monoxide, carbon dioxide, acetone and methyl alcohol.

3. A method according to claim 1 wherein the substrate is at least one member selected from the group consisting of a metal, a metal oxide, a metal nitride, a metal carbide, an alloy, a glass and a ceramic.

4. A method according to claim 1 wherein the substrate is silicon.

5. A method according to claim 1 wherein temperature of the surface of the substrate is 400°–1,200° C., reaction pressure is 0.001–1,000 Torr and microwave is of ISM frequency band.

6. A method according to claim 4 wherein the microwave is of 2.45 GHz.

* * * * *